(12) United States Patent
Ni et al.

(10) Patent No.: US 9,444,398 B2
(45) Date of Patent: Sep. 13, 2016

(54) SEMICONDUCTOR STRUCTURE AND FABRICATING PROCESS FOR THE SAME

(71) Applicant: Taiwan Semiconductor Manufacturing Company, Ltd., Hsinchu (TW)

(72) Inventors: Chyi-Tsong Ni, Hsinchu (TW); I-Shi Wang, Taipei County (TW); Yi-Hsun Chiu, Hsinchu County (TW); Ching-Hou Su, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 277 days.

(21) Appl. No.: 13/750,997

(22) Filed: Jan. 25, 2013

(65) Prior Publication Data

US 2014/0209159 A1    Jul. 31, 2014

(51) Int. Cl.

| | |
|---|---|
| H02S 40/00 | (2014.01) |
| H02S 40/38 | (2014.01) |
| H01L 23/58 | (2006.01) |
| H01M 10/052 | (2010.01) |
| H01M 10/0585 | (2010.01) |
| H01M 10/46 | (2006.01) |

(52) U.S. Cl.
CPC .............. *H02S 40/38* (2014.12); *H01L 23/58* (2013.01); *H01M 10/052* (2013.01); *H01M 10/0585* (2013.01); *H01M 10/46* (2013.01); *H01L 2924/0002* (2013.01); *Y02E 60/122* (2013.01)

(58) Field of Classification Search
None
See application file for complete search history.

(56) References Cited

U.S. PATENT DOCUMENTS

| | | | |
|---|---|---|---|
| 2007/0139001 A1* | 6/2007 | Hahn | ............ H01L 2/0277 320/112 |
| 2011/0228390 A1* | 9/2011 | Lin | ........................ 359/507 |
| 2011/0232761 A1* | 9/2011 | Lomasney | ............... 136/262 |
| 2012/0181568 A1* | 7/2012 | Hsia | ............ H01L 33/0095 257/99 |

FOREIGN PATENT DOCUMENTS

KR    10-2002-0092735 A    12/2002

* cited by examiner

*Primary Examiner* — Ula C Ruddock
*Assistant Examiner* — Scott J Chmielecki
(74) *Attorney, Agent, or Firm* — McDermott Will & Emery LLP (57) ABSTRACT

A semiconductor structure and a fabricating process for the same are provided. The semiconductor structure includes a micro battery cell coupled to a solar cell by a semiconductor fabricating process.

15 Claims, 13 Drawing Sheets

SEMICONDUCTOR STRUCTURE AND FABRICATING PROCESS FOR THE SAME

FIELD

The present disclosure relates to a semiconductor structure and a fabricating process for the same. More particularly, it relates to a semiconductor structure having a micro battery cell coupled to a solar cell and a semiconductor fabricating process for coupling the micro battery cell to the solar cell in the semiconductor structure.

BACKGROUND

In the state of the art, as consumer electronic devices become thinner and microelectronic systems become much smaller, micro batteries are widely used in a variety of fields, such as complementary metal-oxide-semiconductor (CMOS), and micro electro mechanical systems (MEMS), for the sake of miniaturization. For example, the micro electro mechanical systems (MEMS) have micro mechanical components, sensors, and actuators as autonomous complete systems that need micro batteries adapted for use as power supplies.

SUMMARY

In a fabricating process for fabricating a rechargeable battery assembly, the fabricating process includes providing a semiconductor substrate, a solar charger and a micro battery cell. The micro battery cell is formed on the semiconductor substrate. The solar charger is coupled to the micro battery cell.

In a rechargeable battery assembly, the rechargeable battery assembly includes a semiconductor substrate, a micro battery cell and a solar cell. The micro battery cell is formed on the semiconductor substrate. The solar charger is coupled to the micro battery cell.

In a rechargeable battery assembly, rechargeable battery assembly includes a semiconductor substrate, a micro battery cell and a photovoltaic cell. The micro battery cell is formed on the semiconductor substrate. The photovoltaic cell is coupled to the micro battery cell.

The present disclosure may best be understood through the following descriptions with reference to the accompanying drawings, in which:

2

DETAILED DESCRIPTION

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms "top," "bottom," "over," "under" and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

Figure 1:
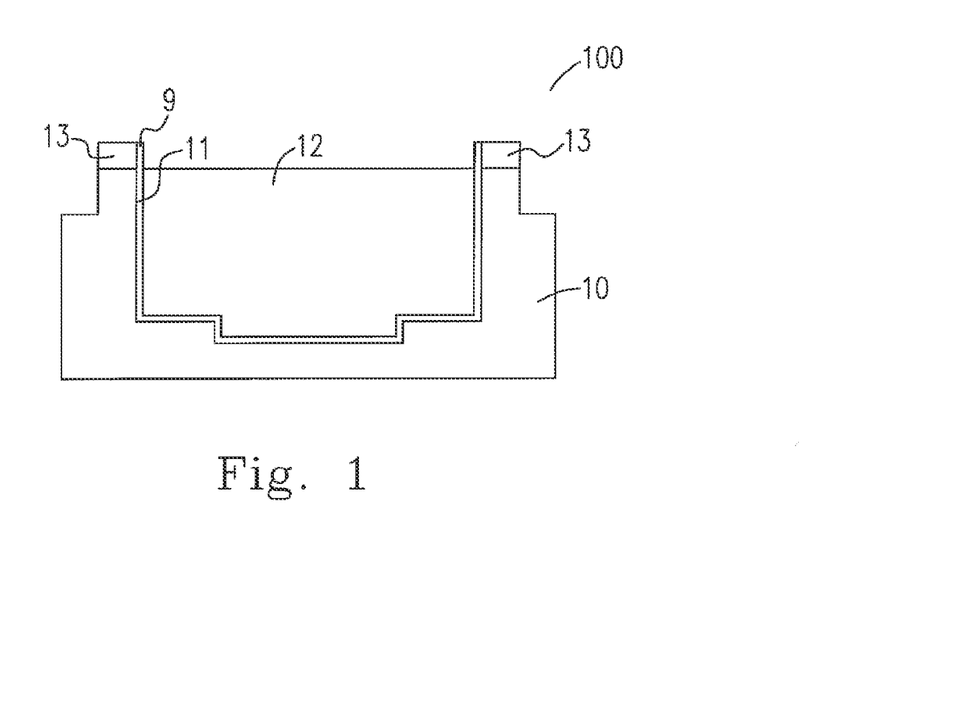
FIG. 1 is a schematic diagram illustrating a first substrate, an anode material and an anode bonding pad in an anode structure in accordance with the present disclosure.

Referring now to FIGS. 1 to 15, a series of transitional structures of a rechargeable battery assembly for a semiconductor fabricating process in accordance with various embodiments of the present disclosure are shown. The rechargeable battery assembly has a solar cell coupled to a micro battery cell by the semiconductor fabricating process. FIG. 1 is a schematic diagram illustrating a first substrate, an anode material and an anode bonding pad in an anode structure in accordance with the present disclosure. In FIG. 1, an anode structure 100 includes a first substrate 10. The first substrate 10 includes silicon (Si), gallium arsenide (GaAs), gallium arsenide-phosphide (GaAsP), indium phosphide (InP), gallium aluminum arsenic (GaAlAs), indium gallium phosphide (InGaP), or the like. A first cavity 11 is formed in the first substrate 10, an anode material 12 is deposited in the first cavity 11 and a pair of anode bonding pads 13 (also referred to as an anode metal portion) is formed on the first substrate 10 by a deposition scheme. The deposition scheme can be a spin-on coating scheme, an ALD scheme, a vapor-based deposition scheme or the like. The anode material 12 includes a graphite, a hard carbon, a soft carbon, an $Li_4Ti_5O_{12}$, an Al, a Zn, an $MnO_4$, a Pb, or the like.

In some embodiments, the pair of anode bonding pads 13 is formed before depositing the anode material 12. In order to give an insulating layer for the anode material 12, a first isolation layer 9 is formed on both a sidewall and a bottom of the first cavity 11 and an inward sidewall of the pair of anode bonding pad 13 by a deposition process.

Figure 2:
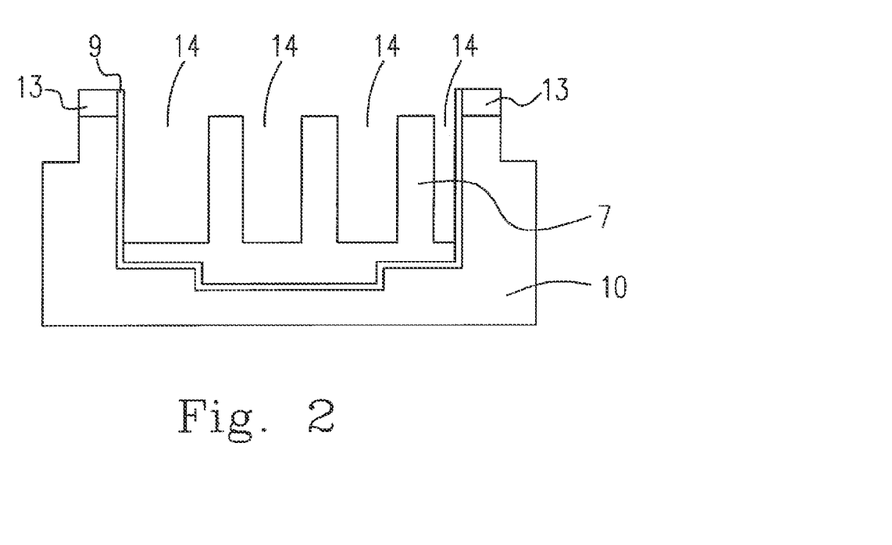
FIG. 2 is a schematic diagram illustrating a first plurality of trenches in an anode structure in accordance with the present disclosure.

FIG. 2 is a schematic diagram illustrating a first plurality of trenches in an anode structure in accordance with the present disclosure. In FIG. 2, an etch process, such as a dry plasma etch, is subsequently implemented to etch the anode material 12 descending and stopping at a predetermined depth, so as to form the first plurality of trenches 14. Accordingly, an anode 7 is formed in a fin structure.

Figure 3:
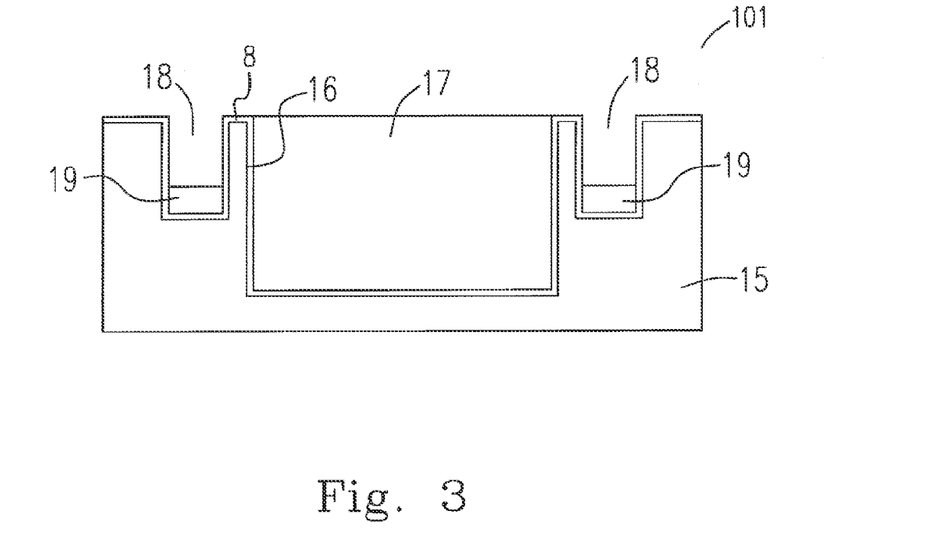
FIG. 3 is a schematic diagram illustrating a second substrate, a cathode material and a cathode bonding pad in a cathode structure in accordance with the present disclosure.

FIG. 3 is a schematic diagram illustrating a second substrate, a cathode material and a cathode bonding pad in a cathode structure in accordance with the present disclosure. In FIG. 3, a cathode structure 101 includes a second substrate 15 made of a silicon (Si), a gallium arsenide (GaAs), a gallium arsenide-phosphide (GaAsP), an indium phosphide (InP), a gallium aluminum arsenic (GaAlAs), an indium gallium phosphide (InGaP), or the like, a second cavity 16 formed in the second substrate 15, and a cathode material 17 deposited in the second cavity 16. A recess 18 is formed neighboring the cavity 16 by an etch scheme, and then a cathode bonding pad 19 (also referred to as a cathode metal portion) is deposited. The recess 18 and the cathode bonding pad 19 are approximately situated at the position corresponding to the anode bonding pad 13. The cathode material 17 includes an $LiCoO_2$, an $LiMn_2O_4$, an $LiNiCoMnO_2$, an $LiNiO_2$, an $CuO_2/Cu_2+$, a $PbO_2/Pb_2+$, or the like.

In some embodiments, the anode bonding pad (also referred to as the anode metal portion) 13 and the cathode bonding pad (also referred to as the cathode metal portion) 19 are made of the same or different materials, which may be a Ge, an AlCu, a Cu, an Au, an In, an Si, an oxide, a Ti, an Al, an Sn, or the like. In some embodiments, the same material is used in the anode bonding pad 13 and the cathode bonding pad 19.

In some embodiments, a second isolation layer 8 is formed on a sidewall and a bottom of both the second cavity 16 and the recess 18, and a top surface of the second substrate 15 by a deposition scheme. Hence, the second isolation layer 8 is continuous and provides an insulation layer for the cathode material 17.

Figure 4:
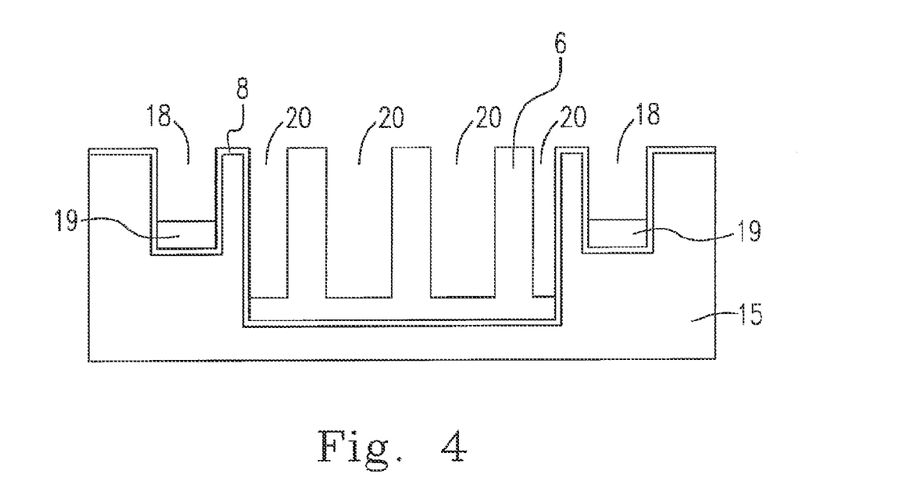
FIG. 4 is a schematic diagram illustrating a second plurality of trenches in a cathode structure in accordance with the present disclosure.

FIG. 4 is a schematic diagram illustrating a second plurality of trenches in a cathode structure in accordance with the present disclosure. In FIG. 4, an etch process is subsequently implemented to etch the cathode material 17 descending to stop at a target thickness, so as to form the second plurality of trenches 20. Accordingly, a cathode 6 is formed in a fin structure.

Figure 5:
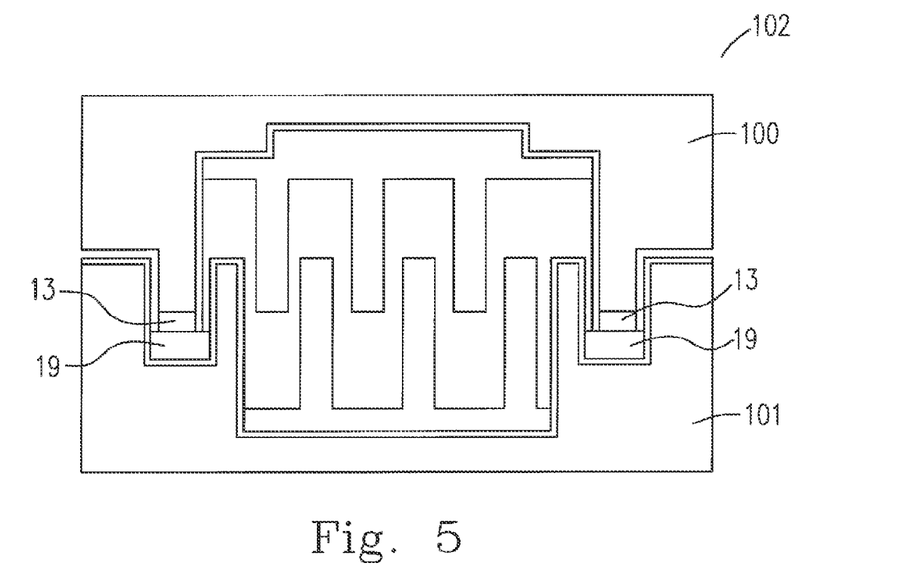
FIG. 5 is a schematic diagram illustrating the anode structure assembled with the cathode structure in accordance with the present disclosure.

FIG. 5 is a schematic diagram illustrating the anode structure assembled with the cathode structure in accordance with the present disclosure. In FIG. 5, in order to form a micro battery cell 102, a bonding scheme is applied to the corresponding anode bonding pad 13 and the cathode bonding pad 19 for bonding the anode structure 100 and the cathode structure 101 together through the anode bonding pad 13 and the cathode bonding pad 19, so as to form a stacked electrode configuration. The bonding process is performed by an anodic bonding process, a vacuum bonding process, an adhesive bonding process, an enhanced bonding process, a plasma activation bonding process, a diffusion bonding process, an eutectic bonding process, a direct bonding process, or the like.

Figure 6:
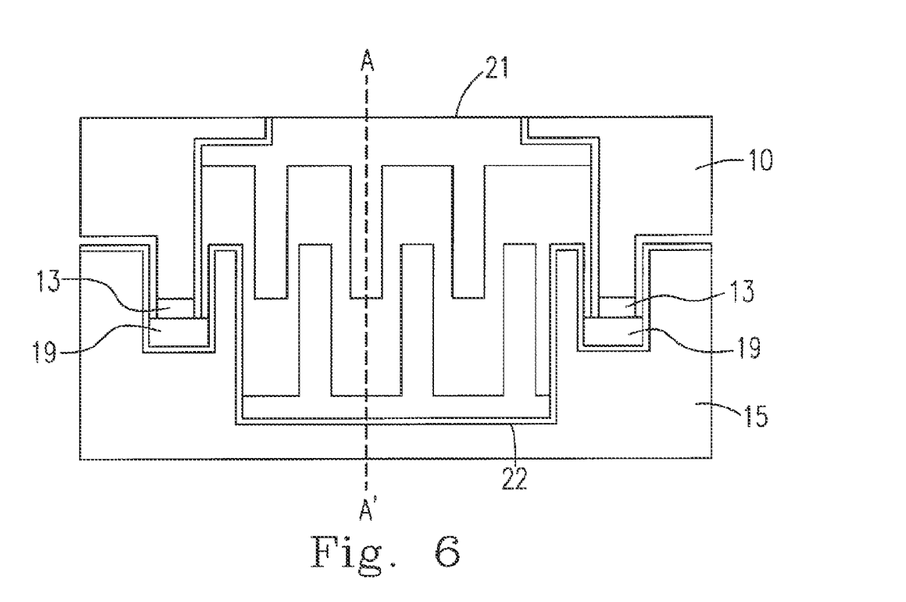
FIG. 6 is a schematic diagram illustrating an anode contact in accordance with the present disclosure.

FIG. 6 is a schematic diagram illustrating an anode contact in accordance with the present disclosure. In FIG. 6, in order to expose an anode contact 21, the excess portion of the first substrate 10 is subsequently removed by a chemical mechanical polishing (CMP) process or an etching process, so as to expose the anode contact 21 buried in the first substrates 10.

Figure 7:
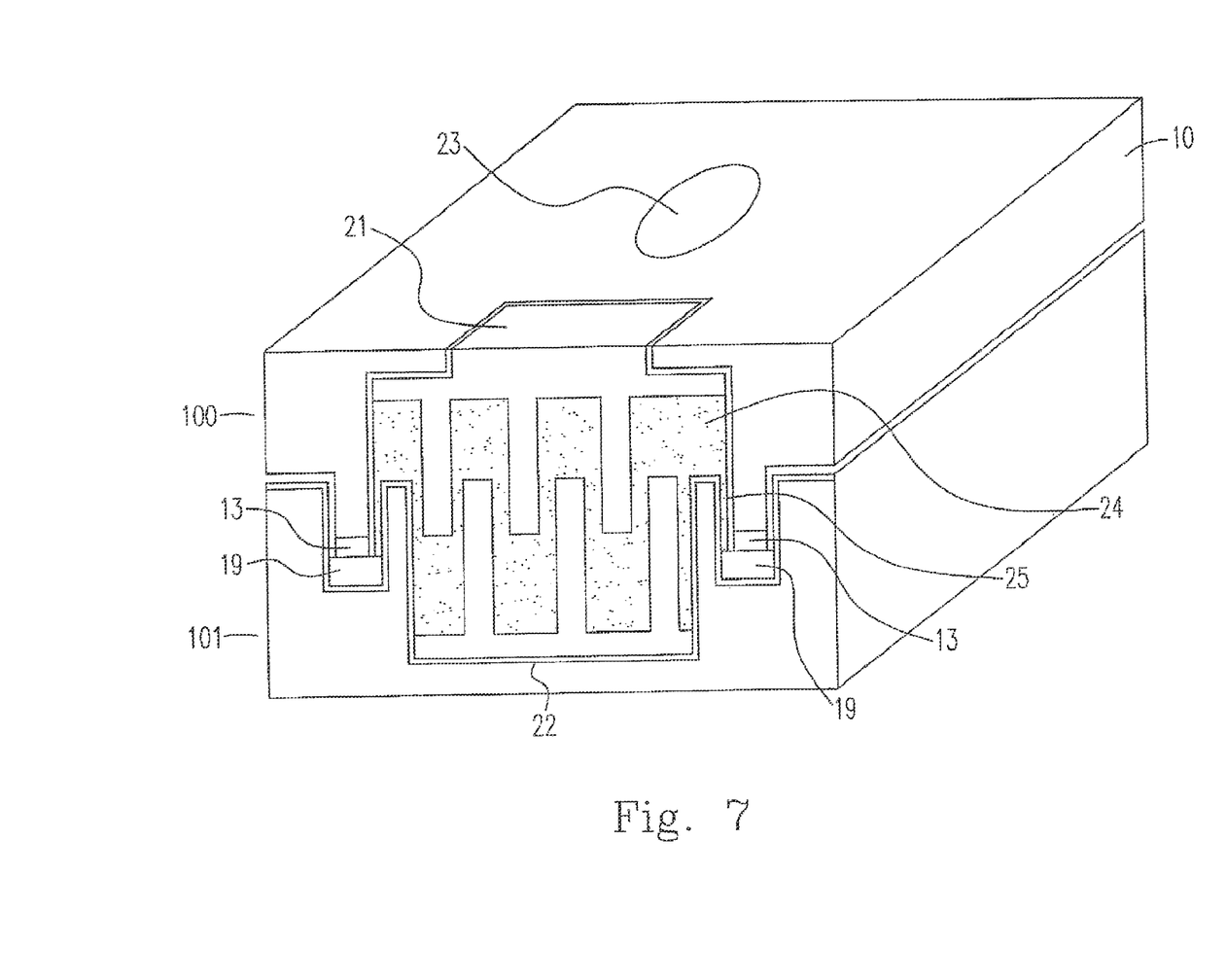
FIG. 7 is a schematic diagram illustrating an opening in the battery cell structure in accordance with the present disclosure.

FIG. 7 is a schematic diagram illustrating an opening in the battery cell structure in accordance with the present disclosure. In FIG. 7, a pore 23 (also referred to as an opening) is formed on the back side of the first substrate 10. Subsequently, a filling scheme is implemented for filling an electrolyte material 24 through the pore 23 into a chamber 25 formed between the anode structure 100 and the cathode structure 101. The electrode material 24 is an $NH_4Cl/ZnCl_2$, an $H_2SO_4$, a Gel polymer electrolyte (PVAc) or the like.

Figure 8:
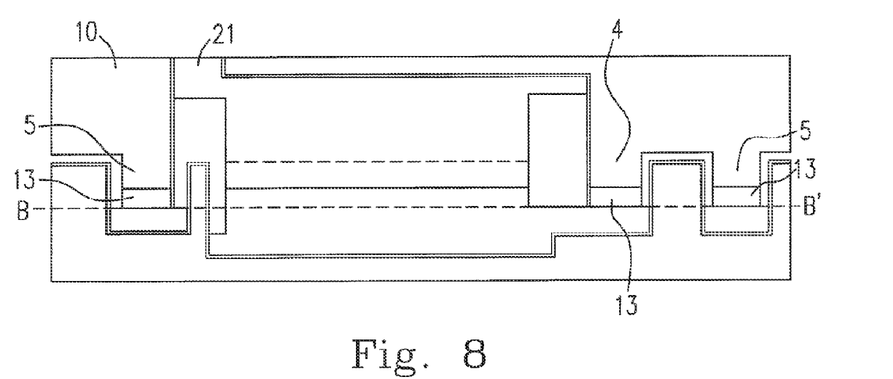
FIG. 8 is a schematic diagram illustrating a side-cross-sectional view of the micro battery cell in accordance with the present disclosure.

FIG. 8 is a schematic diagram illustrating a side-cross-sectional view of the micro battery cell in accordance with the present disclosure. FIG. 8 shows a side-cross-sectional view of the micro battery cell 102 along cross-sectional line A-A' of FIG. 6. The first substrate 10 has a first protrusion 5 and a second protrusion 4 with the anode bonding pad 13 formed thereon. In some embodiments, the bonding pad 13 is not formed on the second protrusion 4.

Figure 9:
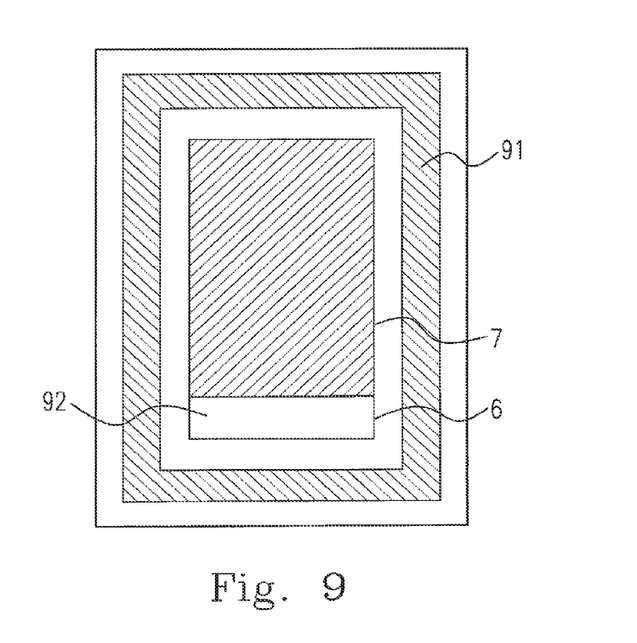
FIG. 9 is a schematic diagram illustrating a vertical-cross-sectional view of the micro battery cell in accordance with the present disclosure.

FIG. 9 is a schematic diagram illustrating a vertical-cross-sectional view of the micro battery cell in accordance with the present disclosure. FIG. 9 shows a vertical-cross-sectional view of the micro battery cell 102 along cross-sectional line B-B' of FIG. 8. A bonding surface 91 is formed while anode bonding pad 13 and the cathode bonding pad 19 (not shown) are attached. The anode 7 approximately covers the cathode 6 but the cathode 6 has a flange 92 extended downward so that the flange 92 is not sheltered by the anode 7. Moreover, the second protrusion 4 is situated on the flange 92.

Figure 10:
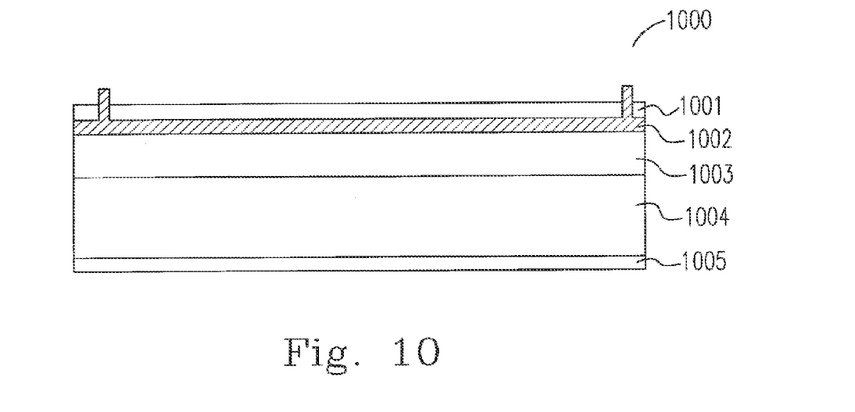
FIG. 10 is a schematic diagram illustrating a solar cell structure in accordance with the present disclosure.

FIG. 10 is a schematic diagram illustrating a solar cell structure in accordance with the present disclosure. In FIG. 10, a solar cell (also referred to as a solar charger) 1000 includes an anti reflection layer 1001 made of an $Si_3N_4$, a MgF2, an AZO, an ITO, a ZnO, a $TiO_2$, or the like, a front contact 1002 made of a thermal conductive oxide, a ZnO, a ZnO/Al, an $SnO_2$, a $Nb_2O_3$, a TiN oxide, or the like, an N-type semiconductor layer 1003 made of an N-doped single crystal Si or an amorphous Si, a P-type semiconductor layer 1004 made of a P-doped single crystal Si or an amorphous Si, and a back contact 1005 made of a Cu, an Au, an Al, a Mo, an Al/Ag, or the like.

In some embodiments, the solar cell includes a thin film solar cell, a dye-sensitized solar cell, a quantum dot solar cell, an organic solar cell, a polymer solar cell, a silicon thin-film cell, or the like.

Figure 11:
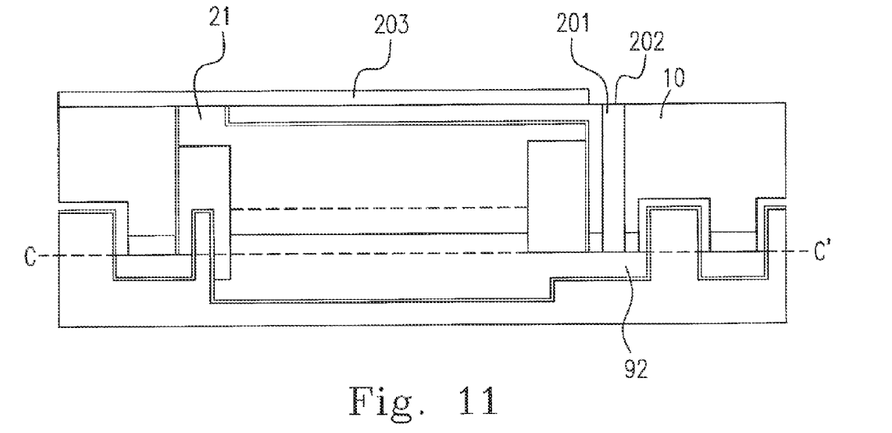
FIG. 11 is a schematic diagram illustrating a bonding pad and a through-silicon-via in accordance with the present disclosure.

FIG. 11 is a schematic diagram illustrating a bonding pad and a through-silicon-via in accordance with the present disclosure. In FIG. 11, a through-silicon-via 201 which is conductive is formed in the first substrate 10 extending from the flange 92 to a top surface of the first substrate 10, and thereby a contact surface 202 of the through-silicon-via 201 is exposed. In order to couple the micro battery cell 102 to the solar cell 1000, a bonding pad 203 made of a Ge, an Al, an AlCu, an In, an Si, an oxide, a Ti, a Cu, an Au, a Sn, or the like is formed on the top surface of the first substrate 10 by a deposition scheme. The bonding pad 203 covers the anode contact 21 but leaves the contact surface 202 exposed. In some embodiments, the bonding pad 203 is formed over the entire top surface of the first substrate 10.

Figure 12:
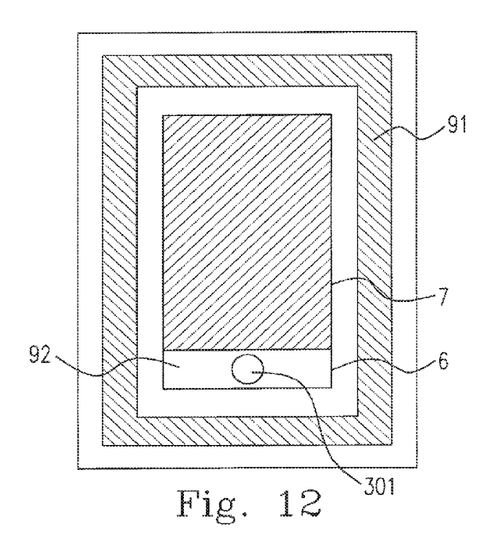
FIG. 12 is a schematic diagram illustrating a vertical-cross-sectional view of the micro battery cell with the through-silicon-via in accordance with the present disclosure.

FIG. 12 is a schematic diagram illustrating a vertical-cross-sectional view of the micro battery cell with the through-silicon-via in accordance with the present disclosure. FIG. 12 shows a vertical-cross-sectional view of the micro battery cell 102 along cross-sectional line C-C' of FIG. 11, with the through-silicon-via 201 (not shown) penetrating the first substrate 10 (not shown). An attaching surface 301 is formed between the through-silicon-via 201 and the flange 92. Since the through-silicon-via 201 has no contact with other components except the flange 92 while penetrating the first substrate 10, the cathode 6 can extend its conductivity to the contact surface 202.

Figure 13:
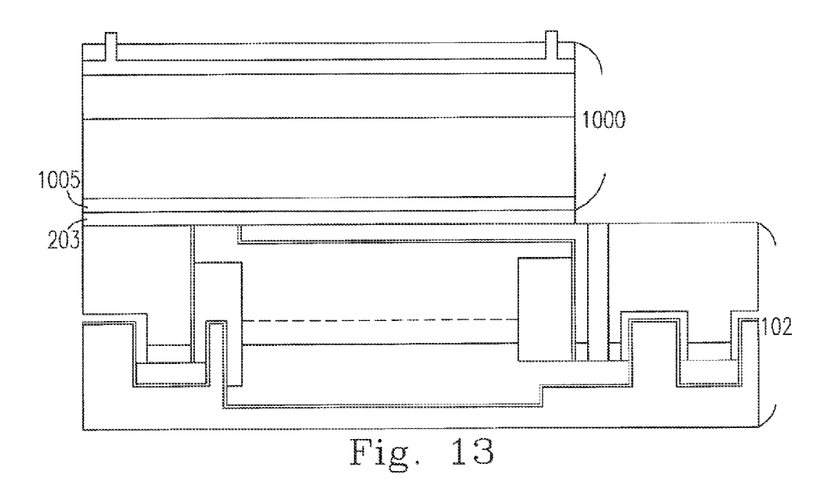
FIG. 13 is a schematic diagram illustrating the solar cell bounded with the micro battery cell in accordance with the present disclosure.

FIG. 13 is a schematic diagram illustrating the solar cell bonded with the micro battery cell in accordance with the present disclosure. In FIG. 13, a bonding scheme is applied to the bonding pad 203 and the back contact 1005 for bonding the micro battery cell 102 and the solar cell 1000 together through the bonding pad 203 and the back contact 1005, so as to form a stacked battery charger configuration. The bonding process is performed by an anodic bonding process, a vacuum bonding process, an adhesive bonding process, an enhanced bonding process, a plasma activation bonding process, a diffusion bonding process, an eutectic bonding process, a direct bonding process, or the like.

Figure 14:
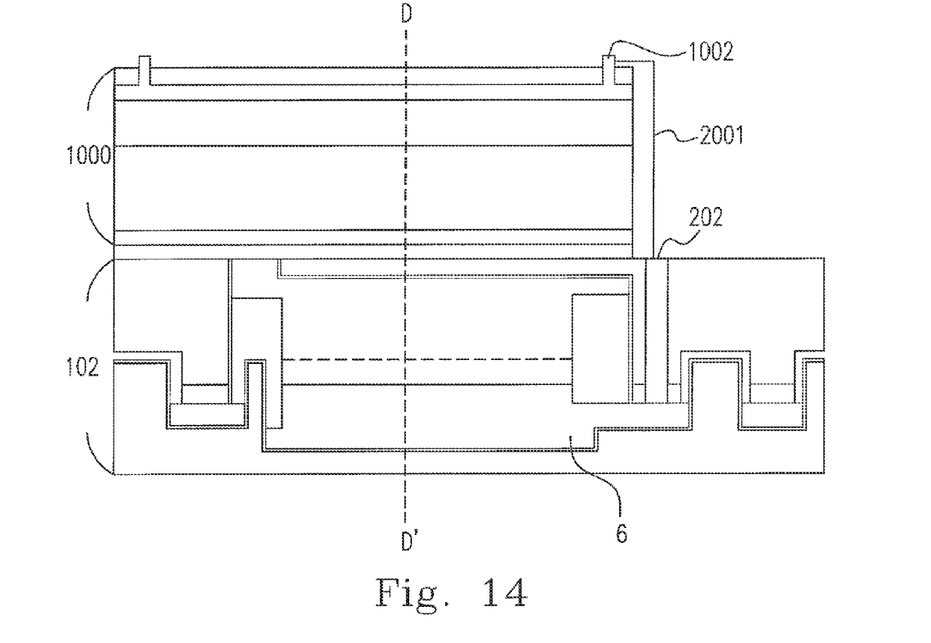
FIG. 14 is a schematic diagram illustrating the solar cell connected to the micro battery cell in accordance with the present disclosure.

FIG. 14 is a schematic diagram illustrating the solar cell connected to the micro battery cell in accordance with the present disclosure. In FIG. 14, in order to interconnect the cathode 6 with the front contact 1002, a wire bonding process is subsequently implemented to form a wiring 2001 which has one end adhered to the contact surface 202 and another end adhered to the front contact 1002. The wiring 2001 completes a circuit of the stacked battery charger configuration. The solar cell 1000 can be a power supply system for the micro battery cell 102. In some embodiments, the solar cell 1000 is a charger for charging the micro battery cell 102.

Figure 15:
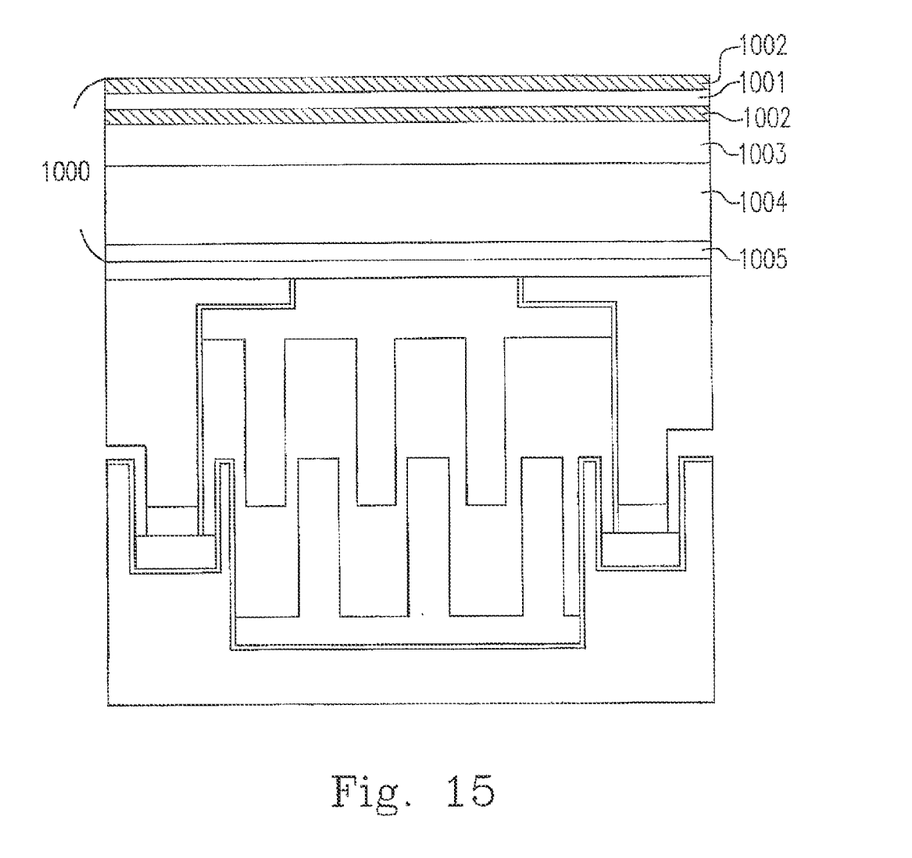
FIG. 15 is a schematic diagram illustrating a front-cross-sectional view of a stacked battery charger configuration in accordance with the present disclosure.

FIG. 15 is a schematic diagram illustrating a front-cross-sectional view of a stacked battery charger configuration in accordance with the present disclosure. FIG. 15 shows a front-cross-sectional view of the stacked battery charger configuration along cross-sectional line D-D' of FIG. 14. The solar cell 1000 is stacked on the micro battery cell 102.

Figure 16:
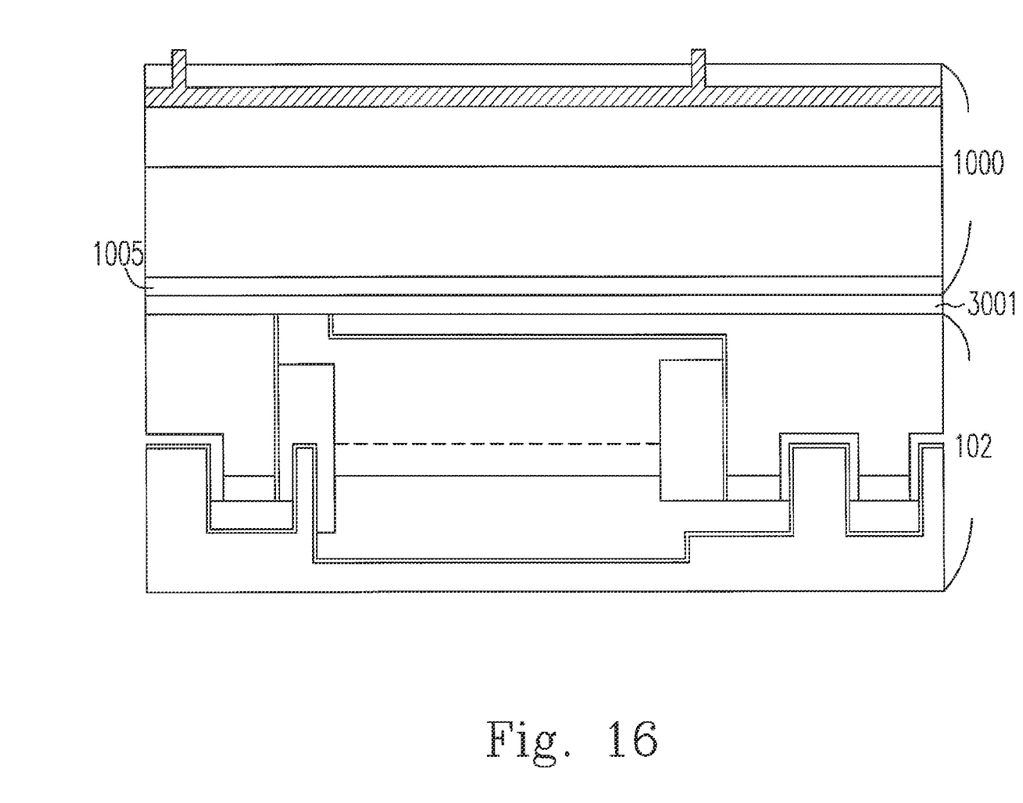
FIG. 16 is a schematic diagram illustrating the solar cell formed on the micro battery cell in accordance with the present disclosure.
Figure 17:
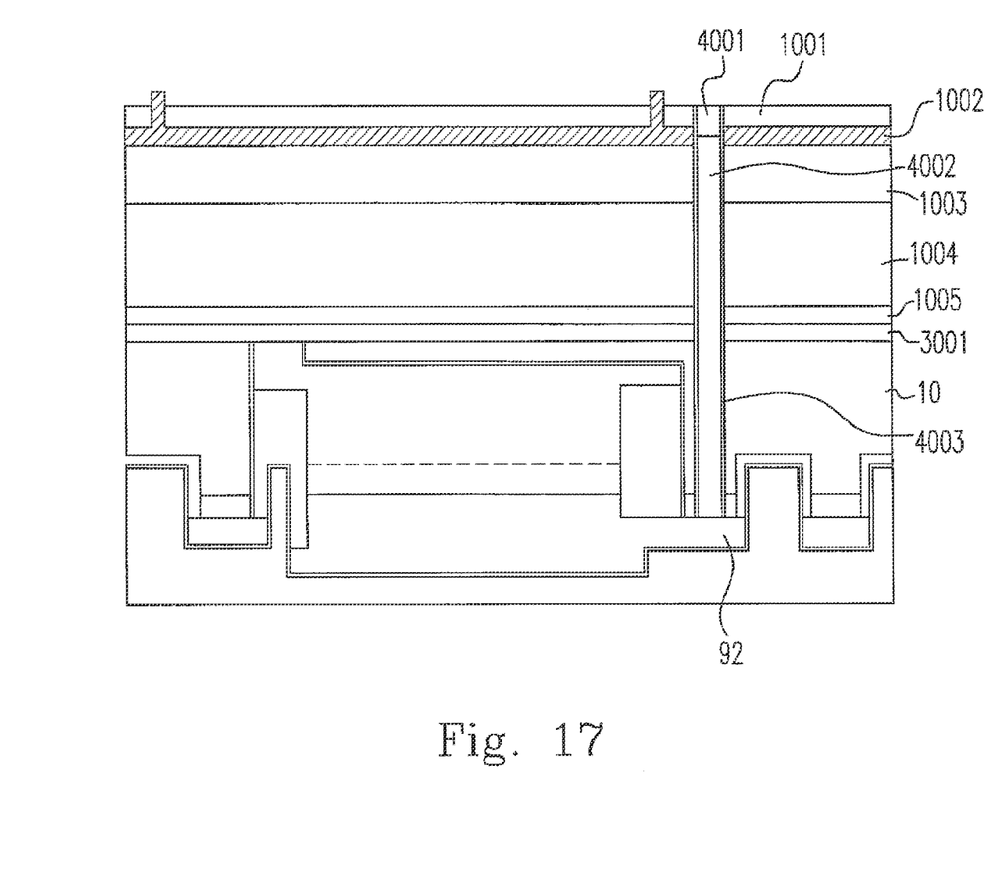
FIG. 17 is a schematic diagram illustrating a through-silicon-via formed in a stacked battery charger configuration in accordance with the present disclosure.

Referring now to FIGS. 16 to 17, a second embodiment in accordance with the present disclosure is shown with a series of transitional structures of a rechargeable battery assembly for a semiconductor fabricating process, and the rechargeable battery assembly has a solar cell coupled to a micro battery cell by the semiconductor fabricating process. FIG. 16 is a schematic diagram illustrating the solar cell formed on the micro battery cell in accordance with the present disclosure. In FIG. 16, in some embodiments, a bonding pad 3001 is formed on a full surface of the micro battery cell 102. The solar cell 1000 is coupled to the micro battery cell 102 by performing a bonding process to couple the bonding pad 3001 and the back contact 1005. It is noted that the solar cell 1000 is situated correspondingly on the micro battery cell 102. In some embodiments, the solar cell 1000 is not provided in a compact product. Firstly, the back contact 1005 is formed on the bonding pad 3001 and the other components of the solar cell 1000 are formed by a deposition scheme.

FIG. 17 is a schematic diagram illustrating a through-silicon-via formed in a stacked battery charger configuration in accordance with the present disclosure. In FIG. 17, a through-silicon-via 4002 which is conductive is formed extending from the flange 92 and through the first substrate 10, the bonding pad 3001, the back contact 1005, the P-type semiconductor layer 1004, and the N-type semiconductor layer 1003. The through-silicon-via 4002 is in proximity to a plain surface of the front contact 1002. An insulation cap 4001 is formed on a top of the through-silicon-via 4002 by a deposition process. In some embodiments, an insulation wall 4003 is formed surrounding the through-silicon-via 4002 for protecting the through-silicon-via 4002 from contacting the first substrate 10, the bonding pad 3001, the back contact 1005, the P-type semiconductor layer 1004, and the N-type semiconductor layer 1003, meaning that a downside end of the through-silicon-via 4002 is attached to the flange 92 and a upside end of the through-silicon-via 4002 is contacted with the front contact 1002 and the insulation cap 4001.

Figure 18:
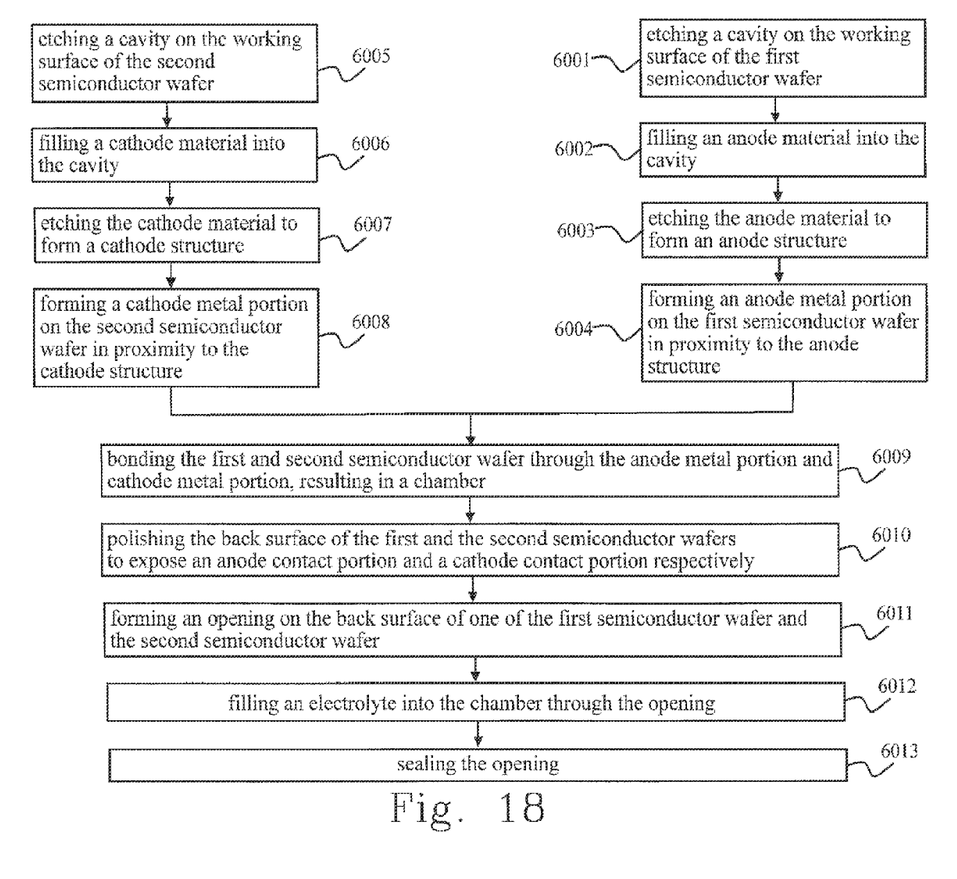
FIG. 18 is a flow chart illustrating the semiconductor fabricating process forming a micro battery cell in accordance with the present disclosure.
Figure 19:
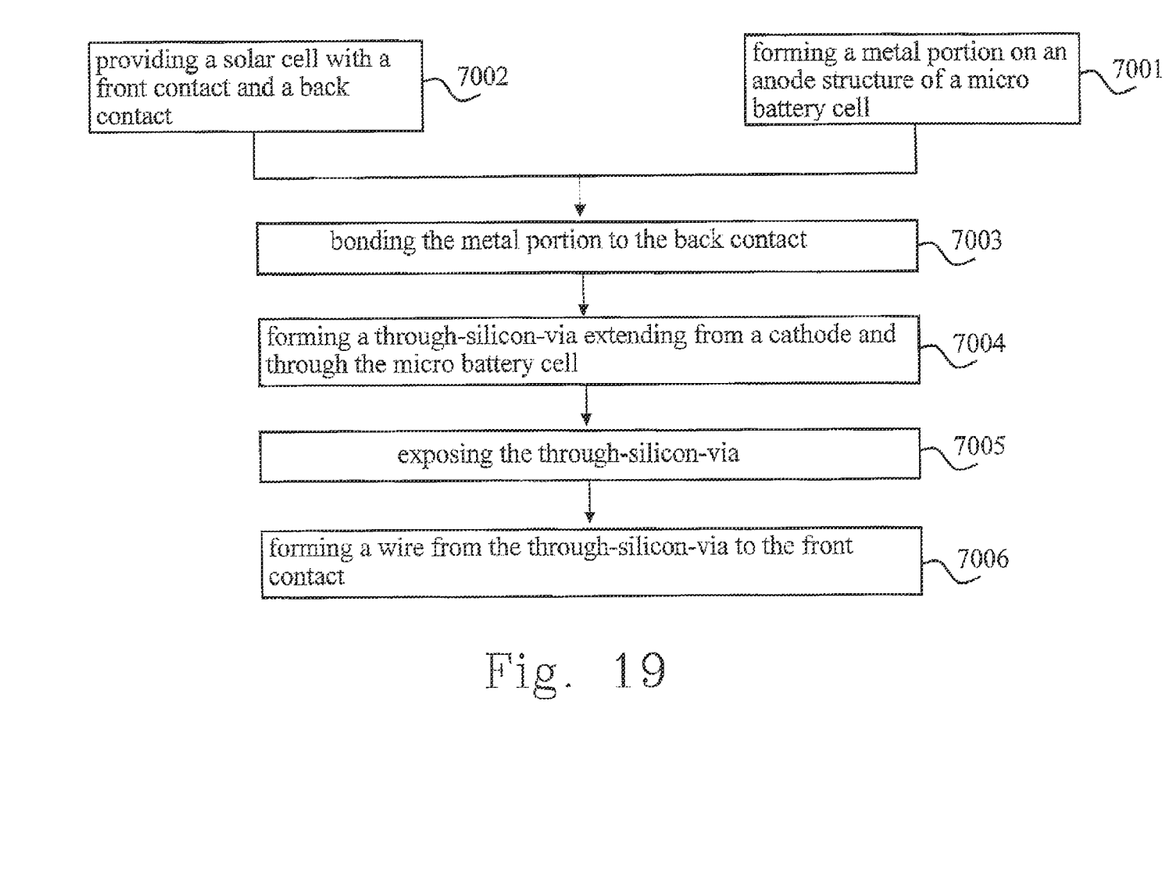
FIG. 19 is a flow chart illustrating the semiconductor fabricating process coupling the solar cell to the micro battery cell in accordance with the present disclosure.

To sum up the above processes for forming a series of above-mentioned transitional structures of a battery cell, a semiconductor fabricating process is accordingly provided. Referring now to FIGS. 18-19, flow charts are provided illustrating the semiconductor fabricating process for forming a micro battery cell having a pair of electrodes and coupling the solar cell to the micro battery cell in accordance with the present disclosure. Steps of the fabricating process are described as follows.

The step 6001 is to etch a cavity on the working surface of the first semiconductor wafer. The step 6002 is to fill an anode material into the cavity. The step 6003 is to etch the anode material to form an anode structure. The step 6004 is to form an anode metal portion on the first semiconductor wafer in proximity to the anode structure. The step 6005 is to etch a cavity on the working surface of the second semiconductor wafer. The step 6006 is to fill a cathode material into the cavity. The step 6007 is to etch the cathode material to form a cathode structure. The step 6008 is to form a cathode metal portion on the second semiconductor wafer in proximity to the cathode structure. The step 6009 is to bond the first and second semiconductor wafer through the anode metal portion and cathode metal portion, resulting in a chamber. The step 6010 is to polish the back surface of the first and the second semiconductor wafers to expose an anode contact portion and a cathode contact portion respectively. The step 6011 is to form an opening on the back surface of one of the first semiconductor wafer and the second semiconductor wafer. The step 6012 is to fill an electrolyte into the chamber through the opening. The step 6013 is to seal the opening.

The step 7001 is to form a metal portion on an anode structure of a micro battery cell. The step 7002 is to provide a solar cell with a front contact and a back contact. The step 7003 is to bond the metal portion to a back contact. The step 7004 is to form a through-silicon-via extending from a cathode and through the micro battery cell. The step 7005 is to expose the through-silicon-via. The step 7006 is to form a wire from the through-silicon-via to the front contact.

While the disclosure has been described in terms of what are presently considered to be the most practical and preferred embodiments, it is to be understood that the disclosure need not be limited to the disclosed embodiments. On the contrary, it is intended to cover various structures. Therefore, the above description and illustration should not be taken as limiting the scope of the present disclosure which is defined by the appended claims.

What is claimed is:

1. A rechargeable battery assembly, comprising:
   a semiconductor substrate;
   a micro battery cell formed on the semiconductor substrate, wherein the micro battery cell comprises a cathode and an anode that extends from the cathode to an anode contact on a top surface of the micro battery cell, and wherein the cathode comprises a flange that extends from beneath the anode within the micro battery cell; and
   a solar charger coupled to the micro battery cell, wherein the solar charger has a front contact and a back contact, wherein the back contact of the solar charger is disposed proximal to the anode contact and wherein the cathode is connected to the front contact of the solar charger at least in part by a through-silicon-via that extends from the flange of the cathode within the micro battery cell to the top surface of the micro battery cell.

2. The rechargeable battery assembly according to claim 1, wherein the anode further comprises a metal portion formed on the anode.

3. The rechargeable battery assembly according to claim 2, further comprising a bonding interface formed between the metal portion and the back contact.

4. The rechargeable battery assembly according to claim 3, wherein the metal portion comprises a Ge, an AlCu, a Cu, an Au, or a Sn.

5. The rechargeable battery assembly according to claim 1, wherein the micro battery cell has an isolation layer and a substrate, and the isolation layer is formed between the substrate and one selected from a group consisting of a cathode, an anode and a liquid electrolyte.

6. The rechargeable battery assembly according to claim 5, wherein the cathode and the anode are one of a pair of oxidation electrodes and a pair of reduction electrodes.

7. A rechargeable battery assembly, comprising:
   a semiconductor substrate;
   a micro battery cell formed on the semiconductor substrate, comprising a cathode and an anode; and
   a photovoltaic cell coupled to the micro battery cell, comprising a front contact and a back contact,
   wherein the anode of the micro battery cell is in contact with the back side of the photovoltaic cell, and the cathode is connected to the front contact at least partially through a through-micro battery-via that extends from a top surface of the micro battery cell to a cathode flange disposed within the micro battery cell.

8. The rechargeable battery assembly according to claim 3, further comprising a wire from a top surface of the through-silicon-via to the front contact.

9. The rechargeable battery assembly according to claim 3, wherein a top surface of the through-silicon-via is free from coverage of the metal portion.

10. The rechargeable battery assembly according to claim 3, wherein the through-silicon-via extends through the micro battery cell and the solar charger and from the cathode to the front contact.

11. The rechargeable battery assembly according to claim 10, further comprising an insulation portion on the through-silicon-via.

12. The rechargeable battery assembly according to claim 10, wherein the through-silicon-via penetrates through the metal portion.

13. The rechargeable battery assembly according to claim 12, wherein the through-silicon-via penetrates through the back contact.

14. The rechargeable battery assembly according to claim 7, wherein the micro battery cell further comprises a metal portion formed on the anode.

15. The rechargeable battery assembly according to claim 7, wherein the through-micro battery-via extends from a portion of the cathode disposed within the micro battery cell through the micro battery cell, through a bonding pad disposed between the anode and the back contact, and through the back contact to the front contact.

* * * * *